United States Patent [19]

Blazo et al.

[11] Patent Number: 5,757,652

[45] Date of Patent: May 26, 1998

[54] ELECTRICAL SIGNAL JITTER AND WANDER MEASUREMENT SYSTEM AND METHOD

[75] Inventors: Stephen F. Blazo, Portland, Oreg.; Jeffrey A. Kleck, Vancouver, Wash.; Aart Konynenberg, Beaverton; Philip Schniter, Portland, both of Oreg.

[73] Assignee: Tektronix, Inc., Wilsonville, Oreg.

[21] Appl. No.: 576,422

[22] Filed: Dec. 21, 1995

[51] Int. Cl.$^6$ .................................................. H04L 7/00
[52] U.S. Cl. ........................... 364/487; 375/371; 375/376
[58] Field of Search .............................. 364/487; 360/31, 360/23; 375/10, 118, 199, 120, 370, 371, 376, 316, 355; 327/158, 105

[56] References Cited

U.S. PATENT DOCUMENTS

| | | | |
|---|---|---|---|
| 4,718,074 | 1/1988 | Mannas et al. | 375/118 |
| 4,811,359 | 3/1989 | Nakajima et al. | 375/10 |
| 5,010,403 | 4/1991 | Wardzala | 358/139 |
| 5,012,494 | 4/1991 | Lai et al. | 375/120 |
| 5,402,443 | 3/1995 | Wong | 375/10 |
| 5,425,060 | 6/1995 | Roberts et al. | 375/371 |
| 5,493,243 | 2/1996 | Ghoshal | 327/158 |
| 5,517,685 | 5/1996 | Aoyama et al. | 455/260 |

OTHER PUBLICATIONS

"Brodacast Quality Video Over SDH Networks; Eradicating Sub Carrier Corruption Due to Pointers," J.A. Shields et al., IBC 95 Intl. Broadcasting Convention Pub. No. 413, pp. 269–273, Sep. 1995, IEE, London, U.K.

"Automate Your Field Testing with the CTS 750 SDH Test Set," Tektronix, Inc., Pub. No. 2GW–9139–0, 1993, Beaverton, Oregon.

"SDH/SONET Telecommunications Standard Primer," Tektronix, Inc., Pub. No. 3SW–8085–1, 1994, Beaverton, Oregon.

*Primary Examiner*—Emanuel T. Voeltz
*Assistant Examiner*—Demetra R. Smith
*Attorney, Agent, or Firm*—Richard B. Preiss; William K. Bucher

[57] ABSTRACT

An electrical signal jitter and wander measurement system (30) operates in real time and digitally controls bandwidths over which the measurements are performed. A digital phase-lock loop ("PLL") (34) includes a phase detector (44), low pass filters (48, 56), an analog-to-digital converter ("ADC") (54), a digital signal processor ("DSP") (32), a direct digital synthesizer ("DDS") (38), and a tracking oscillator (39). The phase detector receives an input signal that is compared with a signal derived from the DDS. The phase detector signal contains wander and jitter data that are filtered and digitized by the ADC. The DSP receives the data and performs a proportional integral control function to lock the PLL by digitally controlling the DDS frequency. The DDS generates a clock signal at a precise rate determined by the phase accumulation registers. The tracking oscillator locks to multiples of the DDS frequency to increase the resolution of the phase measurement. A master reference clock (40) controls the PLL with a stability and accuracy sufficient to measure low frequency wander. Wander data are available from the DSP as an integral of the DDS operating frequency. The DSP also performs the required loop filter function and high pass filters the wander data to provide subband jitter data. This invention digitally controls the PLL filter high pass bandwidth down to very low frequencies to accurately measure low frequency jitter and wander.

44 Claims, 3 Drawing Sheets

ELECTRICAL SIGNAL JITTER AND WANDER MEASUREMENT SYSTEM AND METHOD

TECHNICAL FIELD

This invention relates to electrical signal measurements and more particularly to a system and method for measuring phase jitter and frequency wander in electrical signals conveyed through a wide-bandwidth telecommunications network.

BACKGROUND OF THE INVENTION

Telecommunications networks have evolved dramatically during the 20th century to the point where they include worldwide satellite, microwave, and fiber-optic links for transporting data and video services in addition to voice. The growth in fiber-optic network links has been particularly rapid and has contributed to a dramatic improvement in network reliability, bandwidth, and quality.

However, the first generations of fiber-optic telecommunications systems relied on proprietary architectures, equipment, line codes, multiplexing formats, and maintenance procedures. The providers of these systems wanted standards so they could mix and match equipment from a variety of suppliers. Accordingly, in the late 1980s, the Exchange Carriers Standards Association and the International Telegraph and Telephone Consultative Committee developed a single international standard referred to as the Synchronous Digital Hierarchy ("SDH").

SDH is a fiber-optic data transport system that establishes a wideband transmission technology for worldwide telecommunications networks. The Synchronous Optical Network ("SONET") is its implementation in the United States. The comprehensive SDH/SONET standard is expected to provide the transport infrastructure for worldwide telecommunications well into the 21st century.

SDH/SONET has the same ease of use as the conventional telephone network system; however, its improved configuration flexibility and bandwidth provide significant advantages over the current system. These include the ability to multiplex voice, data, and video signals into a broadband synchronous channel in which individual data bytes can be easily and uniquely identified; reduced equipment requirements; increased network reliability; and a provision for overhead and payload bytes in which the overhead bytes permit management of the payload bytes.

SDH/SONET employs a byte interleaved multiplexing scheme for conveying multiple signals of differing capacities through a synchronous, flexible, optical hierarchy. Byte interleaving simplifies multiplexing and provides an end-to-end network management capability. The SDH/SONET multiplexing process first employs the generation of a lowest level or base signal that is referred to as the Synchronous Transport Signal level-1 ("STS-1"), which operates at 51.84 megabytes per second ("Mbps"). Higher level signals ("STS-N") are integer multiples of STS-1, resulting in a family of STS-N signals as shown in Table 1. An STS-N signal includes N byte-interleaved STS-1 signals. Table 1 also shows an optical counterpart for each STS-N signal, designated Optical Carrier level-N ("OC-N"). In SDH, the base signal is referred to as Synchronous Transport Module level-1 ("STM-1"), which operates at 155.52 Mbps. Higher level signals ("STM-N") are multiples of the base rate.

TABLE 1

| SDH/SONET Signal Hierarchy | | | |
|---|---|---|---|
| Data Rate (Mbps) | CCITT Designation | Electrical Signal | Optical Signal |
| 51.84 | STM-0 | STS-1 | OC-1 |
| 155.52 | STM-1 | STS-3 | OC-3 |
| 622.08 | STM-4 | STS-12 | OC-12 |
| 2488.32 | STM-16 | STS-48 | OC-48 |

Unlike conventional data transmission systems that derive transmission timing from the bit stream itself, SDH/SONET network elements derive their transmission timing from an external timing reference. More particularly, conventional data transmission systems transmit asynchronously, while SDH/SONET transmits synchronously.

Multiplexing signals in asynchronous timing systems requires storage buffers sufficiently large to store entire frames of information, which introduces significant time delays in the system. In contrast, multiplexing incoming signals in the SDH/SONET synchronous system requires only a few bytes of storage buffer to account for the relatively small timing differences.

However, the overall timing behavior of an SDH network is quite different from conventional Pleisochronous Digital Hierarchy ("PDH") networks. In particular, the generation, transmission, accumulation, and impact of timing jitter and wander on data services are fundamentally different. Jitter and wander impacts not only equipment manufacturers and network operators, but also end users, such as television broadcasters, who attempt to use such networks to deliver their signals with the highest quality.

Because the jitter and wander effect in SDH networks is so different, particularly SDH pointer jitter, this also impacts the test equipment used to install, qualify, and maintain hybrid SDH/PDH networks. New jitter and wander measurement methodologies are required because existing methods are no longer suitable and may give unreliable results.

Jitter and wander are defined respectively as the short-term and the long-term variations of the significant instants of a digital signal from their ideal positions in time. For example, a digital signal continually varies in its time position by moving backwards and forwards relative to an ideal clocking source. Jitter and wander on a data signal are equivalent to a phase modulation of a clock signal used to generate the data.

Jitter and wander have both an amplitude—how much the signal is shifting in phase—and a frequency—how quickly the signal is shifting in phase. The standards define frequency variations changing at a rate above 10 Hertz as jitter and phase variations changing at a rate below 10 Hertz as wander. Amplitude is specified in unit intervals ("UI"), such that one UI of jitter is one data bit-width, irrespective of the data rate. Jitter amplitude is normally quantified as a peak-to-peak value rather than an RMS value because it is peak jitter that causes bit errors in network equipment.

Jitter measurements are made relative to a reference clock. By definition, a signal has no jitter when referenced to itself. Therefore, jitter and wander are measured as a phase or frequency difference between the signal being measured and the reference clock.

Excessive jitter and wander cause several problems including logical errors caused by decision circuits not operating at an optimum time; lost data caused by input buffers being either empty or overflowing, causing framing slips, data loss, or data repetition; and degradation in the reconstruction of encoded analog signals. The latter problem is not normally a problem for voice transmissions, but causes significant degradation of digitized television signals, which require high phase stability to convey color information.

Within a SDH/PDH network, many different mechanisms generate, transfer, and transform jitter and wander. In particular, at SDH cross connect, analog-to-digital, and terminating multiplexer nodes, SDH pointer jitter becomes a potentially serious problem. The pointer mechanism in SDH compensates for frequency and/or phase differences between incoming payloads and outgoing frames at such nodes. For example, even though separate SDH networks are synchronized from the same clock, when a payload is cross connected to a different SDH network, temperature variations cause changes in cable propagation delay that result in wander on the line and the clock. In addition, incoming payloads are typically not in phase with either each other or the outgoing SDH frames.

SDH pointers allow the payload to "float" within the SDH frame structure by introducing a step-change in payload phase, either advancing or retarding the payload by up to three bytes relative to the SDH frame. Such pointer movements can introduce significant amounts of jitter into the payload because they can insert a single block of 24 bits of phase justification into a signal, thereby causing a jitter impulse.

Measuring such jitter is difficult because existing jitter measurement instruments have nonideal responses below the typical 10 Hertz jitter/wander demarkation frequency. This is not an issue in conventional PDH networks. However, in SDH/PDH networks, jitter measurement response variations below 10 Hertz can significantly degrade measurement accuracy.

FIG. 1 shows a prior jitter measurement circuit employing a phase-lock loop ("PLL") 10 that includes a phase detector 12, a loop filter 14, a voltage controlled oscillator ("VCO") 16, and a frequency divider 18 to measure jitter on a data input signal conditioned by a clock recovery and prescaler 20. PLL 10 can be used to measure jitter at frequencies as low as the loop bandwidth. If the loop bandwidth is very low, as in certain video measurements, PLL 10 may become unstable. Unfortunately, the amount of jitter measurable, even at low frequencies, cannot exceed the dynamic range of phase detector 12 times the divide ratio used by prescaler 20. The loop bandwidth determines the high pass characteristic of the jitter measurement and is difficult to control because it is strongly influenced by the gain of VCO 16, which is difficult to control.

FIG. 2 shows a prior wander measurement circuit 22 employing phase detector 12 to compare the phase of the data input signal conditioned by clock recovery and prescaler 20 with a reference signal generated by, for example, a reference clock 24 that synchronizes a direct digital synthesizer ("DDS") 26. The wander measurement range is limited by the dynamic range of phase detector 12 and the divide ratio used by prescaler 20. If a large divide ratio is used, the wander measurement loses resolution.

Another disadvantage of prior jitter and wander measuring systems relates to their typically analog implementation. A wide variety of signal rates, types, formats, and standards requires jitter and wander measurements. Prior analog measuring systems typically measure only jitter or wander and require using different sets of prescalers, PLLs, and loop filters to measure a particular signal rate, type, format, or standard.

What is needed, therefore, is a unified jitter and wander measurement system and method that measures the wide variety of signal rates, types, formats, and standards with a single programmably reconfigurable apparatus. Moreover, the jitter and wander measurements should be stable and accurate and cover an increased measurement frequency range.

SUMMARY OF THE INVENTION

An object of this invention is, therefore, to provide an apparatus and a method for measuring jitter and wander on electrical signals.

Another object of this invention is to provide an apparatus and a method for measuring jitter and wander on a wide variety of signal rates, types, formats, and standards.

A further object of this invention is to provide a single programmably reconfigurable apparatus for meeting the above-described objects.

Still another object of this invention is to provide an apparatus and method that provides stable and accurate jitter and wander measurements over an increased and adjustable measurement frequency range.

In a preferred embodiment, an electrical signal jitter and wander measurement system operates in real time and digitally controls multiple bandwidths over which the measurements are performed. A PLL includes a phase detector, a low pass filter ("LPF"), an analog-to-digital converter ("ADC"), a digital signal processor ("DSP"), a DDS, and a tracking oscillator followed by a prescaler. The phase detector receives an input signal that is compared with a signal derived from the DDS. The phase detector signal contains jitter and wander data that are filtered and digitized by the ADC. The DSP receives the ADC data and performs a proportional integral control function to lock the PLL by updating a phase accumulation register in the DDS. The DDS generates a clock signal at a precise rate determined by the phase accumulation registers. The tracking oscillator locks to a harmonic of the DDS frequency to increase the resolution of the phase measurement. A master reference clock controls the PLL with a stability and accuracy sufficient to measure low frequency wander. Wander data are available from the DSP as an integral of the DDS operating frequency. The DSP also performs the required loop filter function and high pass filters the wander data to provide subband jitter data. This invention digitally controls the PLL filter high pass bandwidth down to very low frequencies to accurately measure low frequency jitter and wander.

Additional objects and advantages of this invention will be apparent from the following detailed description of a preferred embodiment thereof that proceeds with reference to the accompanying drawings.

DETAILED DESCRIPTION OF A PREFERRED EMBODIMENT

Figure 1:
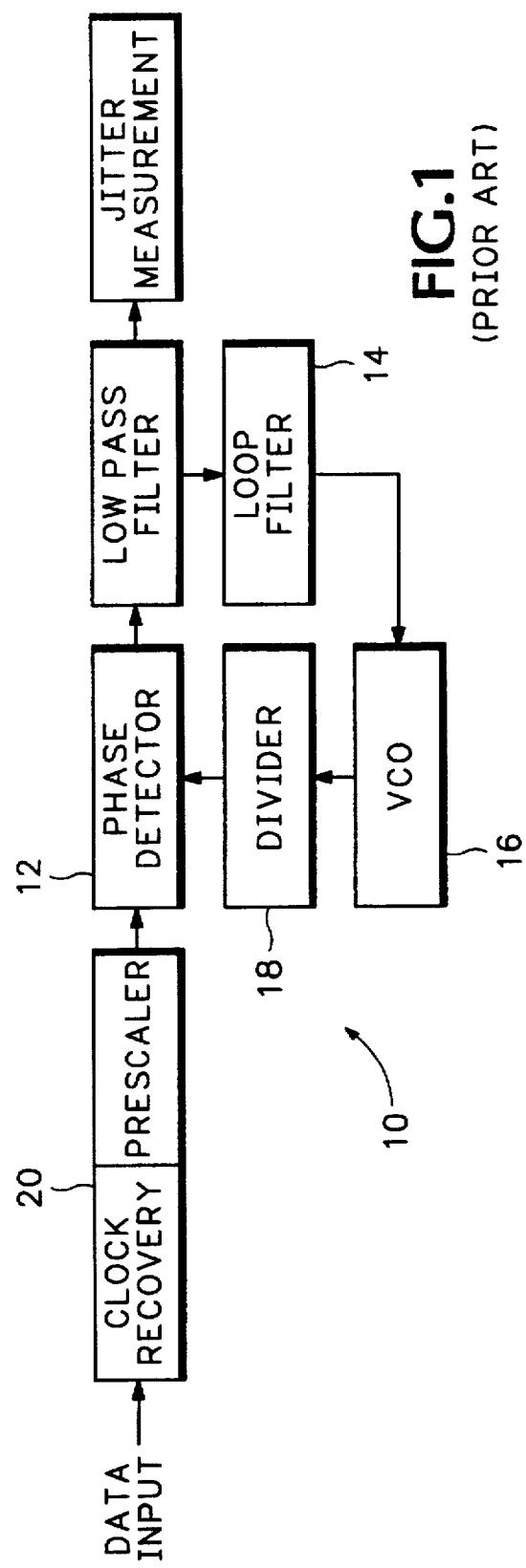
FIG. 1 is a schematic block circuit diagram of a prior art jitter measurement system employing a PLL to measure phase jitter in an electrical signal.
Figure 2:
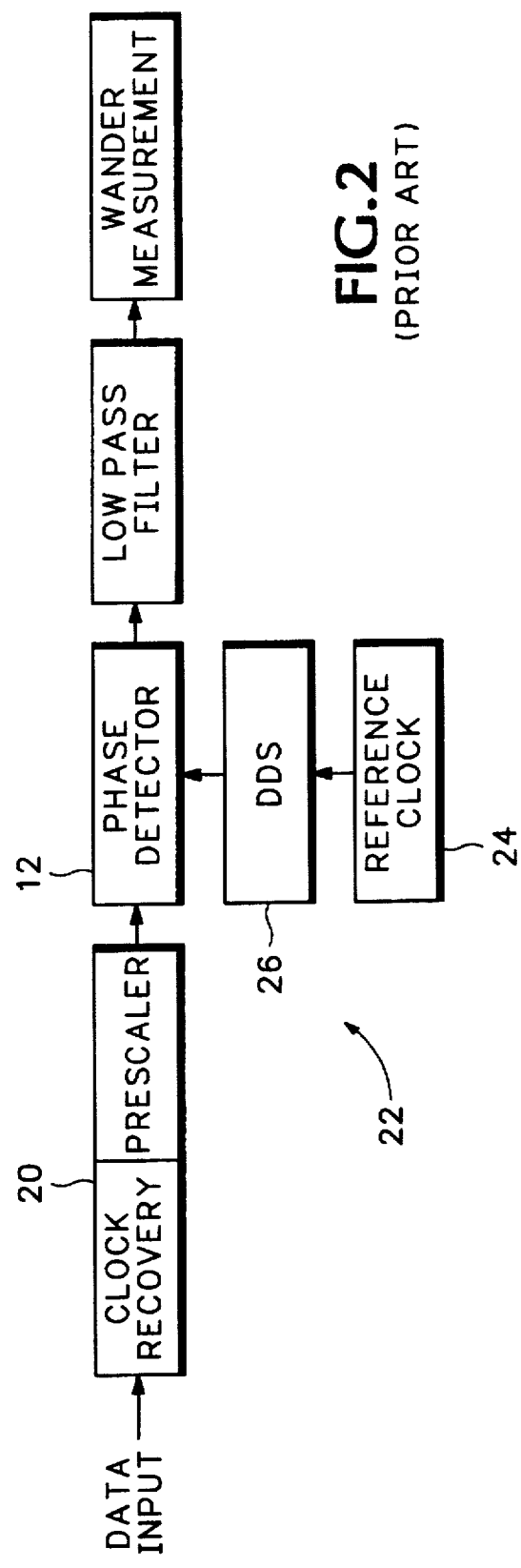
FIG. 2 is a schematic block circuit diagram of a prior art wander measurement system employing a phase detector to measure phase changes between a reference clock and an electrical signal.
Figure 3:
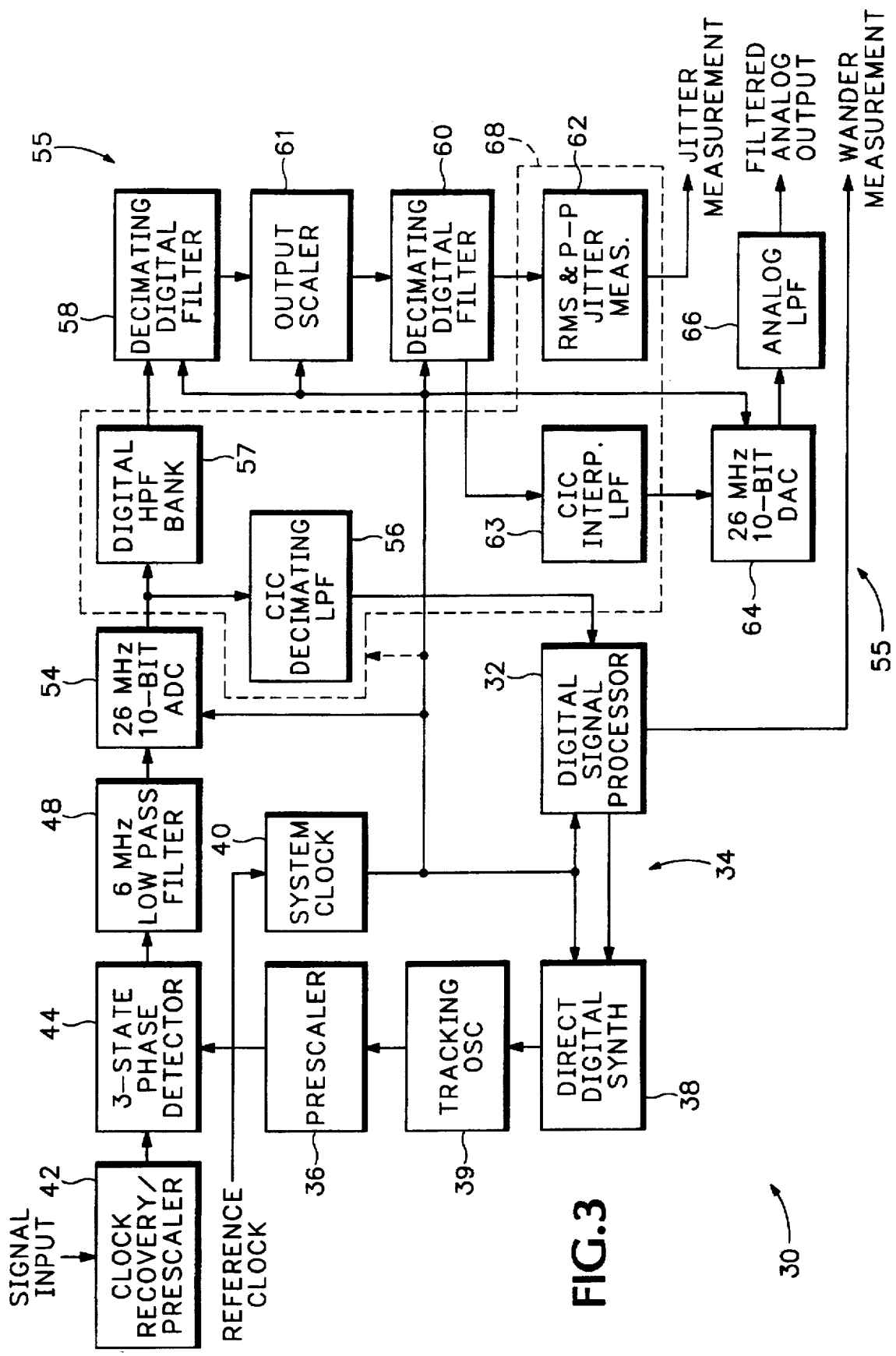
FIG. 3 is a schematic block diagram of a combined jitter and wander measurement system of this invention employing a digital PLL, digital filters, and a DSP.

FIG. 3 shows a jitter and wander measuring apparatus ("JAWA") 30 of this invention that employs a DSP 32 controlling a PLL 34 to phase-lock a signal received from a prescaler 36 to a clock recovered and optionally prescaled from an incoming signal. JAWA 30 is preferably implemented as an optional plug-in device to a model CTS 750 SDH Test Set that is manufactured by the assignee of this application. The loop bandwidth of PLL 34 is controllable by DSP 32. Incoming signal phase jitter above the loop bandwidth appears as a phase difference between the signal from prescaler 36 and the recovered clock. Phase jitter below the loop bandwidth appears as an integral of the frequency adjustments required to adjust a DDS 38 frequency that is suitably multiplied by a tracking oscillator 39 and prescaler 36 to phase-lock PLL 34 to the incoming signal frequency.

PLL 34 serves multiple purposes including extracting the jitter signal from the incoming signal, generating nominal input frequency estimates at discrete time intervals, and implementing steep, low pass or high pass filtering. The input frequency estimates are used to calculate wander, and the low pass and high pass filtering is employed in various bandwidths of jitter or wander measurements.

JAWA 30 also measures what is referred to as subband jitter. Subband jitter is phase noise occurring in a frequency range having a user-settable high pass frequency and a 2.5 kiloHertz low pass frequency set by the loop bandwidth controlled by DSP 32. Subband measurements are particularly useful for measuring SDH pointer jitter and wander.

A system clock 40 generates a 25.92 Mhz signal that controls the timing and synchronizing functions in JAWA 30. To ensure measurement stability and accuracy, system clock 40 is locked to a reference clock, such as a cesium atomic clock preferably having a Stratum-1 rating to support jitter and wander measurements or a Stratum-3 rating if only jitter measurements are required.

Incoming signal formats, rates, and ranges supported by JAWA 30 preferably include a wide-range of signaling formats employed by electrical and electro-optical systems, such as nonreturn-to-zero, return-to-zero, code-mark-inversion, alternate-mark-inversion, and conventional clock signals having signaling rates up to at least about 2.5 Gigabits per second. Wideband and highband jitter is measured for all the above-described signals in two ranges with nominally ±2 UI and ±10 UI dynamic range.

JAWA 30 includes multiple functional sections. A clock recovery and prescaler circuit 42 recovers a clock signal from an incoming electrical or electro-optical signal, such as a data signal, in a manner that preserves the jitter on the incoming data transitions up to at least a frequency required by the applicable standard. The recovered clock signal is appropriately prescaled for phase comparison with the signal from prescaler 36 by a phase detector 44, which is preferably a Motorola MCK12140 having a ±2π radian dynamic range.

Phase detector 44 is preferably a three-state phase detector that has a linear phase-to-voltage characteristic which allows direct evaluation of phase differences between the recovered and prescaled incoming signal and the prescaler 36 signal. Assuming that the nominal frequencies of the two signals are equal, meaning the PLL is locked, the output signal from the phase detector is almost directly suitable for measuring jitter. More particularly, the output signal is a pulse-width-modulated version of the jitter signal and requires only low pass filtering to extract the jitter signal. Peak jitter measurements are accomplished by determining the maximum amplitude of the filtered output from phase detector 44 over a predetermined time interval.

Tracking oscillator 39 is preferably a Z-Comm voltage-controlled oscillator operating in a frequency range of 400–800 Mhz that is locked to a 100th harmonic of a 4 MHz to 8 MHz signal generated by DDS 38. DDS 38 is preferably an Analog Devices 7008 that is locked to the 25.92 MegaHertz system clock 40 and frequency updated by DSP 32 at a 202.5 kiloHertz rate. Prescaler 36 provides a programmable frequency multiple such that tracking oscillator 39 is suitable for use with all preferred incoming signal rates. To ensure stability, the tracking bandwidth of tracking oscillator 39 is significantly greater, preferably about 30 kiloHertz, than the 2.5 kiloHertz maximum bandwidth of PLL 34.

The output signal generated by phase detector 44 is filtered by a 6 Mhz analog LPF 48 that antialiases the signal for digitizing by a 10-bit ADC 54 having a 25.92 MHz digitization rate. ADC 54 is preferably an Analog Devices 9050.

The digitized data from ADC 54 drives both PLL 34 and a jitter measurement circuit 55 that is described later. The 25.92 MHz digitization rate of the data in PLL 34 is converted to the 202.5 KHz sampling rate of DSP 32 by a 2-stage cascaded decimating interpolator comb low pass ("CIC") filter 56. CIC filter 56 preferably has a decimation ratio of 128, a 17 microsecond magnitude, and a constant 5 microsecond group delay at the 202.5 KHz sampling rate, which makes it highly suitable for anti-aliasing the data prior to processing by DSP 32.

DSP 32, preferably a Motorola 56002, performs a loop filter function for PLL 34, extracts wander and subband data, and performs control and analysis functions. More particularly, DSP 32 receives filtered data from CIC filter 56 and processes it by mimicking an analog second-order active loop filter function. DSP 32 utilizes the filtered data to update the frequency-determining registers of DDS 38. This process occurs on precise submultiple time increments of the 25.92 megaHertz system clock 40, preferably at a 202.5 Khz updating rate. The loop filter program executed by DSP 32 preferably implements the function represented below by equation 0:

$$DDS(n) - DDS(0) = K_P*ADC_{Net}(n-1) + K_I* \sum_{j=1}^{n-1} ADC_{Net}(j) \qquad (0)$$

where n equals the n time slot determined by the sampling rate. $ADC_{Net}$ is ADC 54 values from 0 to 1024 with the zero position deleted (zero is a calibration constant).

The number of DSP bits required to support the process is determined as follows. ADC 54 provides 10-bit numbers ($ADC_{Net}$ is approximately a signed nine-bit number). The bandwidth of PLL 34 is at least 10 Hertz. Therefore, there are at most 20,000 samples in the summation before the ADC value returns to zero because of a transient. The largest value for $K_p$ is about 2,500. Moreover, in low-bandwidth cases such as this, $K_I$ is always less than 1. Therefore, 24-bit arithmetic is sufficient to support the summation function.

The calculation of $K_P$ and $K_I$ follows standard analog PLL models in which the assumptions and constants used are DDS sensitivity equals 0.006 Hertz/bit, damping factor equals 5, and phase detector 44 gain depends on the divider ratio of prescaler 36 and the percentage of ADC 54 dynamic range used. Assuming 90 percent of ADC 54 dynamic range is used, the gain in the 2 UI mode equals 73 bits/radian, in the 4 UI mode equals 37 bits/radian (subband uses this mode); and in the 20 UI mode equals 7.3 bits/radian.

Using the above-described assumptions and factors, the constants shown in Table 2 can be derived.

TABLE 2

| Rate Mbps | Range UI | PLL Bandwidth Hertz | $K_P$ | $K_1$ |
|---|---|---|---|---|
| 2 | 2 | 20 | 90 | $5.7^4$ |
| 2 | 4 (subband) | 2,500 | $2.33^3$ | 18.0 |
| 2 | 20 | 20 | 720 | $4.6^3$ |
| 34 | 2 | 100 | 28.5 | $9.0^4$ |
| 34 | 4 (subband) | 2,500 | $1.43^3$ | 1.12 |
| 34 | 20 | 100 | 228 | $7.2^3$ |
| 52 | 2 | 100 | 19 | $6.0^4$ |
| 52 | 4 (subband) | 2,500 | 953 | 0.747 |
| 52 | 20 | 100 | 152 | $4.8^3$ |
| 139 | 2 | 200 | 14 | $1.12^2$ |
| 139 | 4 (subband) | 2,500 | 175 | 1.9 |
| 139 | 20 | 100 | 112 | 0.096 |
| 155 | 2 | 100 | 14 | $1.12^2$ |
| 155 | 4 (subband) | 2,500 | 175 | 1.9 |
| 155 | 20 | 100 | 112 | 0.096 |
| 622 | 2 | 100 | 3.5 | $2.8^3$ |
| 622 | 4 (subband) | 2,500 | 43.8 | 0.48 |
| 622 | 20 | 100 | 28 | $2.4^2$ |

Figure 4:
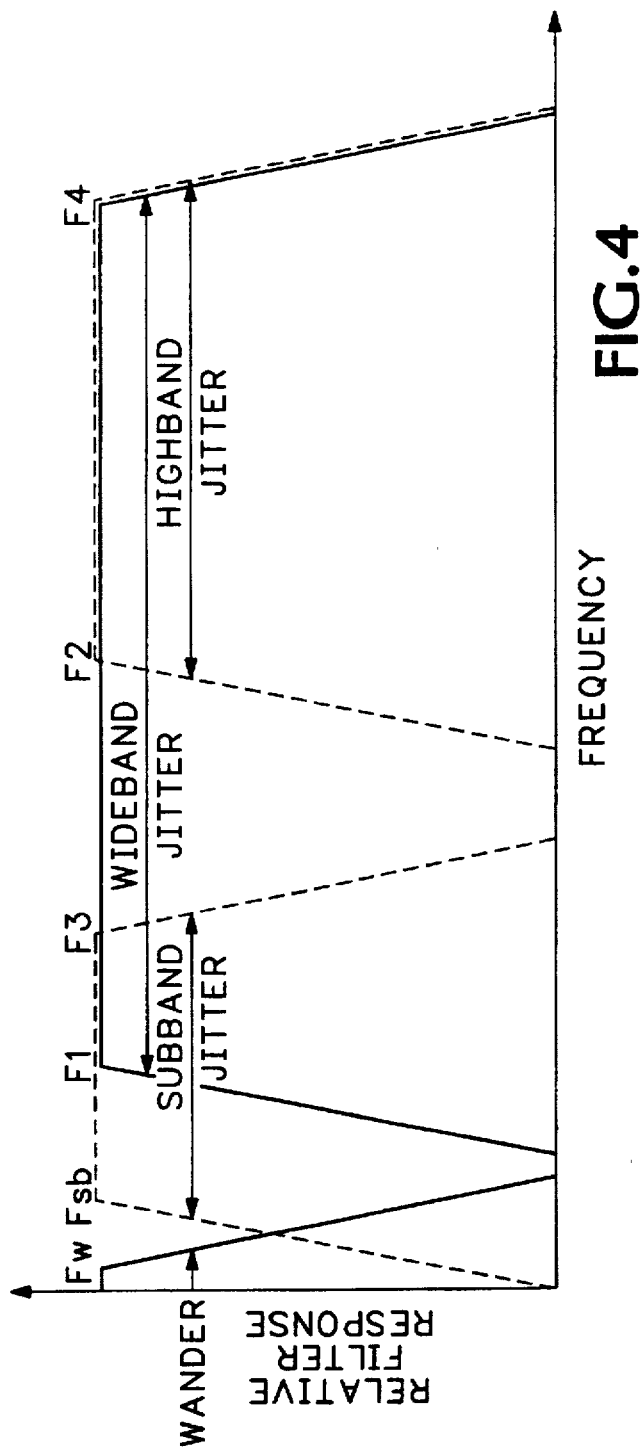
FIG. 4 is a simplified graph showing filter breakpoints and relative filter responses required to perform the various wander, subband, and jitter measurements of this invention.

This invention measures jitter in three frequency bands that are referred to as a subband, a wideband, and a highband. Each frequency band requires that the input signal be appropriately filtered before peak-to-peak variations are measured. Preferred filter breakpoints and bandwidths for measuring jitter on various input signal types are shown in FIG. 4 and Table 3.

TABLE 3

| Signal Type Mbps | $F_y/2$ MHz | $F_y/10$ MHz | $F_1$ loop Hz | $F_2$ high pass KHz | $F_4$ low pass KHz |
|---|---|---|---|---|---|
| 1.544 | 0.722 | 0.1544 | 10 | 8 | 40 |
| 2.048 | 1.024 | 0.2048 | 20 | 18 | 100 |
| 8.448 | 4.224 | 0.8448 | 20 | 3 | 400 |
| 34.368 | 17.184 | 3.4 | 100 | 10 | 800 |
| 44.736 | 22.368 | 4.4736 | 10 | 30 | 400 |
| 51.84 | 26.0 | 5.184 | 100 | 20 | 400 |
| 139.264 | 70.0 | 13.9264 | 200 | 10 | 3.5 K |
| 155.52 | 77.5 | 15.552 | 200/500 | 65 | 1.3 K |
| 622.08 | 311.0 | 62.208 | 200/1K | 250 | 5.0 K |

The low pass filters preferably have at least 60 decibel ("dB") per decade attenuation slope, or rolloff. The subband breakpoints are not input signal dependent. Frequency $F_3$ is preferably fixed at 2.5 kiloHertz and frequency $F_{ab}$ is selectable between about 0.02 Hertz and about 20 Hertz.

Wander is defined as the cumulative phase offset of the input signal relative to system clock 40. Wander is calculated by integrating over time the instantaneous frequency difference between the input signal and system clock 40. It is sufficient to evaluate a discrete version of the integral that requires that averaged clock frequencies are computed over regular time intervals. The averaging is implemented by first-order low pass filtering the jitter signal to a frequency $F_w$, which is fixed at 10 Hertz for all input signals. To collect wander data over a long time interval, wander data samples are collected at rates as low as 30 Hertz.

Referring not to jitter measurement circuit 55, the input signal shown in FIG. 3 is optionally prescaled by a factor of two or 10 by clock recovery and prescaler 42. When implementing jitter filters in jitter measurement circuit 55, the fundamental component of the input signal is preferably attenuated by at least 60 db, and preferably at least 70 dB, to prevent its energy from corrupting the jitter measurement. The first three columns of Table 3 show various possible values of the input signal fundamental frequency and their related divide by two and divide by 10 frequencies.

In wideband jitter mode, phase detector 44 extracts a high pass filtered jitter signal from the input signal, and PLL 34 processes the extracted signal as before through 6 MHz LPF 48 and ADC 54 before further processing by jitter measurement circuit 55. In wideband jitter mode, DSP 32 provides the high pass filtering at frequency $F_1$, and a digital high pass filter ("HPF") bank 57 provides filtering at frequency $F_2$, both in accordance with Table 3. When measuring jitter on lower data rate signals, the transition band is very small compared to the 29.92 MHz sampling rate. A first-order infinite impulse response ("IIR") filter is preferred to meet the transition band requirements.

A cascaded pair of digital decimation filters ("DDFs") 58 and 60 coupled by an output scaler 61 provide low pass filtering at frequency $F_4$ in accordance with Table 3. The resulting wideband-filtered jitter signal is measured by a jitter processor 62 that computes the RMS and peak-to-peak jitter amplitude over a predetermined time interval, preferably 0.125 second. Depending on input signal type, DDFs 58 and 60 may decrease the sampling rate by a factor of up to 64.

Analog reconstruction of the jitter signal first employs a CIC filter 63 to interpolate the decimated output of DDF 60 back up to 25.92 MHz. The interpolated data from DDF 60 is then conveyed to a 10-bit digital-to-analog converter ("DAC") 64 that performs conversions at the 25.92 MHz rate. The analog reconstructed version of the jitter signal is reconstructed by an analog LPF 66.

In the highband jitter measurement mode, phase detector 44 extracts a jitter signal from the input signal while PLL 34 maintains a fixed loop-bandwidth as specified for $F_1$ in Table 3. The jitter signal is processed as before by 6 MHz LPF 48, ADC 54, and HPF bank 57. DDFs 58 and 60 provide the same low pass filtering as in the wideband mode, and the result is conveyed to jitter processor 62 for computing the RMS and peak-to-peak jitter amplitude over a predetermined time interval.

As described for the wideband jitter measurements, the decimation filters may decrease the sample rate by as much as a factor of 64, and the output of DDF 60 is routed, as before, through CIC filter 63, DAC 64, and analog LPF 66 for analog reconstruction of the jitter signal.

An Altera FLEX 8000 series field-programmable gate array 68 is preferably employed to implement CIC LPF 57, HPF bank 57, jitter processor 62, and CIC filter 63.

In the subband jitter measurement mode, PLL 34 tracks the input signal over a fixed loop-bandwidth of about 2.5 kiloHertz. In addition to implementing the loop filter, DSP 32 integrates the digitized output of phase detector 44 to recover the subband jitter signal. DSP 32 then high pass filters the subband jitter signal and stores a record of peak jitter values.

There are alternative embodiments for performing wander measurements. In a first embodiment, PLL 34 tracks the input signal over a fixed loop bandwidth of 10 Hertz. DSP 32 implements the 10 Hertz loop filter, an integrator, and generates a frequency updates for DDS 38. Wander measurements are made relative to system clock 40 and are processed by accumulating the difference between each new frequency value and a constant representing the system clock frequency. The result is normalized to account for the integration period, which in this case is the update rate of DSP 32.

In a second embodiment, wander measurements are made in a manner similar to a subband jitter measurement. The bandwidth of PLL 34 is fixed at 2.5 kiloHertz to provide a fast and solid phase lock. As in the first embodiment, DSP 32 implements the loop filter, an integrator that recovers the wander signal from digitized output of phase detector 44, and a 10 Hertz LPF to determine the wander signal bandwidth. DSP 32 samples, decimates, and stores the integrated and filtered wander signal at a preferred 30 Hertz sample rate to generate the wander measurement.

Figure 5:
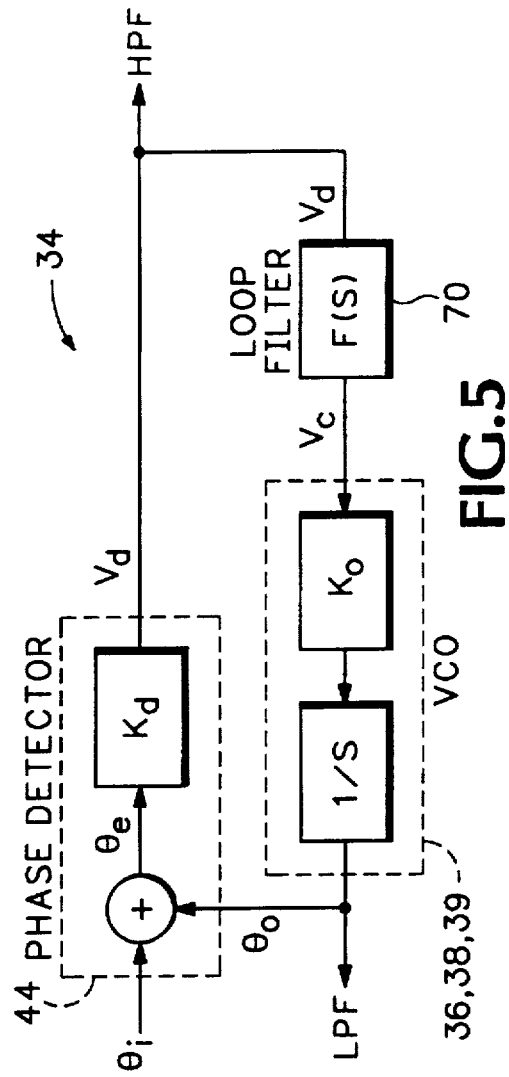
FIG. 5 is a schematic functional block diagram showing a mathematical model of the PLL of this invention.

Because PLL 34 is digitally based and preferably employs digitally implemented filters, integrators, and oscillators, the mathematical basis of these implementations is described below with reference to FIG. 5.

PLL 34 is described in terms of its loop bandwidth, which is determined by its open-loop transfer function. The high pass filter ("HPF") output signal is derived from the phase error signal $V_d$ that is generated by phase detector 44. The phase detector gain (in volts/radian) is represented by a constant $K_d$ and the VCO gain (in radians/second/volt) is represented by a constant $K_o$. F(s) represents the Laplace transfer function of a loop filter 70.

The closed-loop transfer function $H_{HPF}(s)$ of PLL 34 in a high pass filtering mode is represented below by equation 1.

$$H_{HPF}(s) = \frac{sK_d}{s + K_d K_o F(s)} \quad (1)$$

The corresponding closed-loop transfer function $H_{LPF}(s)$ of PLL 34 in a low pass filtering mode is represented below by equation 2.

$$H_{LPF}(s) = \frac{K_d K_o F(s)}{s + K_d K_o F(s)} \quad (2)$$

Loop filter 70 typically includes a proportional component and an integral component. It is advantageous to include a lead component as well, which results in the transfer function represented below by equation 3.

$$F(s) = \frac{K_I}{S} + K_P + K_D \left( \frac{s}{s + 2\pi f_p} \right) \quad (3)$$

The lead component deters any detrimental effects of digitally induced delays on the loop dynamics. A certain amount of time delay is unavoidable when implementing loop filter 70 on DSP 32 because of digitization delays in ADC 54 and in the implementation of the digital control algorithm. Typically, time delays above $3/\Omega_{loop}$ a (where $\Omega_{loop}$ is the loop bandwidth in radians/second) cannot be compensated for and cause an unstable loop. For adequate loop response, the maximum tolerable loop delay is about $0.3/\Omega_{loop}$. The frequency at which the lead controller response flattens out is represented by $f_P$.

The maximum loop bandwidth of PLL 34 is determined by the subband and wideband jitter measurement frequency band requirements listed in Table 3. The $F_1$ column shows no wideband mode HPF requirements with more than a 1 kiloHertz loop bandwidth. However, the subband mode requires a fixed 2.5 kiloHertz loop bandwidth that determines the maximum loop bandwidth of PLL 34.

Assuming a desired loop bandwidth $\zeta_{des}$ and a damping factor $\zeta_{des}$ in a range of three to five, the loop gains are determined by assuming a dominant single pole as represented below by equations 4 and 5:

$$K_P = \frac{2\pi f_{des}}{K_o K_d}, \text{ and} \quad (4)$$

$$K_I = K_o K_d \left( \frac{K_P}{2\zeta_{des}} \right)^2. \quad (5)$$

Simulations show that it is preferred to add the lead component to the loop filter. Assuming the system parameters shown below in Table 4, resulting preferred values for the lead controller gains and the net frequency response error caused by PLL 34 filtering and loop delays are shown below in Table 5.

TABLE 4

| $K_o$ | $K_d$ | $N_{delay}$ | $F_1$ | $\zeta_{des}$ |
|---|---|---|---|---|
| 50 MHz/V | 0.2 V/cycle | 2 samples | 202.5 KHz | 5.0 |

The preferred lead controller gains include small adjustments necessary to make the dominant pole approximation exact, meaning that equations 4 and 5 provide the exact proportional and integral gains for the preferred damping factor and corner frequency.

TABLE 5

| PLL config. | $K_D$ | $f_p$(Hz) | error(dB) |
|---|---|---|---|
| 1,000 Hz HPF | 7.0e$^5$ | 600 | +1.1 |
| 500 Hz HPF | 2.2e$^4$ | 600 | +0.5 |
| 200 Hz HPF | 7.5e$^4$ | 600 | +0.25 |
| 100 Hz HPF | 4.0e$^4$ | 600 | +0.1 |
| 20 Hz HPF | 9.0e$^7$ | 600 | +0.02 |
| 10 Hz HPF | 4.7e$^7$ | 600 | +0.01 |
| 1,000 Hz LPF | −7.5e$^3$ | 50 | +0.1 |
| 10 Hz LPF | 0 | | +0.08 |

The loop filters are described above in the continuous-time (Laplace) domain. Implementing the loop filters in DSP 32 requires transforming them to the discrete-time, or z, domain. This is accomplished by employing a bilinear transformation with prewarping as represented below by equation 6.

$$s = 2F_s \left( \frac{1 - z^{-1}}{1 + z^{-1}} \right) \quad (6)$$

Equation 6 maps the imaginary axis of the s plane to the unit circle of the z plane. $F_s$ is the system sample rate, which is preferably 202.5 kiloHertz.

Prewarping ensures that a desired analog frequency ($\Omega_d$) is mapped exactly to its corresponding digital frequency ($\omega_d$) and is required because of the nonlinear frequency mapping between the continuous- and discrete-time domains as represented below by equation 7.

$$\Omega = 2F_s \tan \left( \frac{\omega}{2} \right) \quad (7)$$

The loop filter breakpoint is preferably preserved across both domains, therefore determining the necessary prewarping. Equations 6 and 7 can then be combined into an expression that maps from an analog prototype in the s domain to the digital implementation in the z domain. The combined expression is represented below as equation 8:

$$s = \Omega_I \cot \left( \frac{\Omega_I}{2F_s} \right) \cdot \left( \frac{1 - z^{-1}}{1 + z^{-1}} \right), \quad (8)$$

where $\Omega_I$ is the preferred loop bandwidth in radians/second.

The controller transfer function is a second-order IIR filter in the z domain as represented below with generic coefficients by equation 9.

$$F(z) = \frac{b_0 + b_1 z^{-1} + b_2 z^{-2}}{1 + a_1 z^{-1} + a_2 z^{-2}} \quad (9)$$

Actual coefficients are obtained by combining equations 3 and 8 into equation 9. The filter can then be implemented by employing the difference equation represented below by equation 10.

$$y_n = b_0 x_n + b_1 x_{n-1} + b_2 x_{n-2} - a_1 y_{n-1} - a_2 y_{n-2} \quad (10)$$

Referring again to FIG. 5, an integrator is inherent in analog or digital implementations of the VCO functions of PLL 34. However, in a digital implementation, DSP 32 does not have direct access to the low pass filtered PLL signal because it exists only in the analog domain. Therefore, deriving samples of the loop phase from the frequency samples generated by F(z) entails DSP 32 implementing an integration function that mimics the one inherent in DDS 38. This is necessary for implementing subband jitter and wander measurements.

The integrator implementation is based on the expression represented below by equation 11.

$$H_I(s) = \frac{1}{s} \rightarrow H_I(z) = F_s \left( \frac{1}{1 - z^{-1}} \right) \quad (11)$$

The calculation of the updated frequency value of DDS 38 from the integrator output is equivalent to a gain stage and can, therefore, be incorporated into the numerator constant shown below in equation 12. DSP 32 then mimics the entire VCO structure including tracking oscillator 39, DDS 38, and prescaler 36. This is referred to in well-known control system terminology as a "plant,"P(z), both domains of which are represented below by equation 12.

$$P(s) = \frac{K_o}{s} \rightarrow P(z) = \frac{K_o F_s}{1 - z^{-1}} \quad (12)$$

Referring again to FIG. 3, PLL 34 should preferably recover from an out-of-lock condition. Because phase detector 44 responds to the out-of-lock condition by generating a positive or negative limit voltage, DSP 32 can attempt to correct the out-of-lock condition when the phase detector 44 output voltage digitized by ADC 54 exceeds a predetermined positive or negative threshold value. DSP 32 responds by switching the loop filter coefficients to a set corresponding to a wider loop bandwidth and waiting a predetermined amount of time for PLL 34 to lock. If PLL 34 is still out-of-lock after the predetermined time period, DSP 32 responds by switching the loop filter coefficients to another set corresponding to an even wider loop bandwidth. The process repeats until PLL 34 locks.

Decimating digital filters 58 and 60 provide the low pass filtering required for measuring wideband and highband jitter. DDFs 58 and 60 functionally replace a complex bank of analog LPFs with two Harris HSP 43168 decimating digital filters. In JAWA 30, each DDF implements a length 16D-1 symmetric finite impulse response ("FIR") filter with an efficient polyphase structure, where D is the decimation ratio. Data and filter coefficients are preferably represented with at least 10 bits of accuracy. FIR filters are symmetric, thereby ensuring a linear phase response.

By cascading DDFs 58 and 60, a multistage decimation filter is implemented that efficiently provides multiple programmable filters. This is particularly necessary for filtering a 2 Megabit per second incoming signal when prescaler 42 has a division ratio of 10. In this case, the filter passband extends to 100 kiloHertz, but DDFs 58 and 60 should attenuate a 200 kiloHertz fundamental frequency that is more than 60 dB above the jitter signal amplitude. A general rule for determining the length of an FIR filter is represented below by equation 13.

$$N = \frac{D\infty(S_p, S_s)}{\Delta F/F} \quad (13)$$

The numerator of equation 13 is a function of the passband and stopband ripple specifications, and the denominator is a ratio of the transition band width to the sampling frequency. Multistage decimation is advantageous because each of DDFs 58 and 60 may relax its ΔF/F ratio. In the two-stage cascaded implementation, DDF 58 heavily decimates the signal to reduce the sampling rate that DDF 60 processes, thereby allowing a proportional reduction in the length of DDF 60 as indicated by a decrease of parameter F in equation 13. DDF 58 can also be made relatively short because a very wide ΔF range is allowed.

Multistage filtering is also advantageous when quantized data and coefficients are employed. In the Harris HSP43168 DDF, the 10-bit data representation limits stopbands to about 65 dB of attenuation. By choosing filter characteristics that attenuate offending signals twice, once in each of DDFs 58 and 60, attenuations greater than 70 dB are achieved.

Preferred parameters for the multistage filter design of DDFs 58 and 60 are listed below in Table 6. $D_1$ and $D_2$ are the first and second stage decimation ratios. Mag @ $F_4$ is the attenuation at the desired passband edge. Mag @ $F_0/10$ is the attenuation at the clock-divided fundamental frequency (indicative of the stopband performance required), the −3 dB breakpoint is the passband edge.

TABLE 6

| Signal Type Mbps | $D_1$ | $D_2$ | Mag @$F_4$ dB | Mag @$F_0/10$ dB | Breakpoint −3 dB |
|---|---|---|---|---|---|
| 1.544 | 16 | 4 | −2.3 | −105 | 44.1 KHz |
| 2.0 | 16 | 2 | −4.1 | −80 | 90.6 KHz |
| 34. | 2 | 4 | −3.0 | −125 | 800.0 KHz |
| 44.736 | 2 | 4 | −3.0 | −125 | 400.0 KHz |
| 52 | 2 | 4 | −3.0 | −125 | 400.0 KHz |
| 140 | 1 | 1 | −3.0 | −120 | 3.5 MHz |
| 155 | 2 | 2 | −3.1 | −120 | 1.29 MHz |
| 622 | 1 | 1 | −3.0 | | 5.0 MHz |

The filter required for subband jitter measurements requires implementing only the high pass portion of the total subband filter. The low pass filtering portion of the subband filter is implemented by PLL 34. Because DSP 32 checks ADC 54 for over-range and out-of-lock conditions, it is preferred that high pass filtering follows such processes. Also, because PLL 34 implements a LPF, the subband filtering discussed below follows the loop filter and the VCO functions shown in FIG. 5.

The subband filters have breakpoints ranging from about 0.02 Hertz to about 20 Hertz. The data rate of DSP 32 is 202.5 kiloHertz, which is a factor of five million above the lowest required filter breakpoint.

The design and implementation of suitable subband IIR filters have challenges that stem from finite precision effects, particularly when implemented on a fixed point DSP processor, such as DSP 32. Fortunately, DSP 32 can operate with 48-bit coefficients during arithmetic operations.

The subband IIR filters are preferably second-order Butterworth high pass filters. The low order minimizes coefficient quantization problems, and employing Butterworth filters advantageously places both zeros at the origin of the s plane. The Laplace transfer function for the subband IIR filters is represented below by equation 14:

$$H(s) = \frac{s^2}{(s - \Omega_n e^{j\frac{3\pi}{4}})(s - \Omega_n e^{-j\frac{3\pi}{4}})}, \quad (14)$$

$\Omega_n$ where an is the natural frequency in radians/second, and for a second-order filter, the natural frequency corresponds to a −6 dB breakpoint. However, the cutoff frequency, $f_{sh}$ Hertz, corresponds to a −3 dB breakpoint, but can be related to the natural frequency as represented below in equation 15.

$$\Omega_n = \frac{2\pi f_{sh}}{1.425} \quad (15)$$

By employing the bilinear transform described in connection with equation 6, a discrete equivalent of equation 15 is represented below in equation 16.

$$H(z) = \frac{1 - 2z^{-1} + z^{-2}}{\left[1 - \frac{\Omega_n}{F_s}\cos\left(\frac{3\pi}{4}\right) + \left(\frac{\Omega_n}{2F_s}\right)^2\right] - 2z^{-1} + \left[1 + \frac{\Omega_n}{F_s}\cos\left(\frac{3\pi}{4}\right) + \left(\frac{\Omega_n}{2F_s}\right)^2\right]z^{-2}} \quad (16)$$

Equation 16 can be simplified because some of the quantities in the equation are insignificantly small. In particular, the variable $\delta$ can be represented as shown below in equation 17:

$$\delta = -\frac{\Omega_n}{F_s}\cos\left(\frac{3\pi}{4}\right) = f_{sh}\left(\frac{\pi\sqrt{2}}{1.425 F_s}\right) << 1, \quad (17)$$

and because $\delta$ is small compared to one, equation 16 can be rewritten as shown below in equation 18.

$$H(z) = \frac{1 - 2z^{-1} + z^{-2}}{\left[1 + \delta + \frac{1}{2}\delta^2\right] - 2z^{-1} + \left[1 - \delta + \frac{1}{2}\delta^2\right]z^{-2}} \quad (18)$$

Further approximations for a small value of $\delta$ are represented below as equations 19:

$$1 + \delta^2 \approx 1, \quad \frac{1 + \delta}{1 - \delta} \approx 1 + 2\delta, \text{ and } \frac{1}{1 - \delta} \approx 1 + \delta, \quad (19)$$

which allow the high pass filter to be expressed as shown below in equation 20.

$$H(z) \approx \left(\frac{1}{1 + \delta}\right) \cdot \frac{1 - 2z^{-1} + z^{-2}}{1 - (2 - 2\delta)z^{-1} + (1 - 2\delta)z^{-2}} \quad (20)$$

Because $\delta$ is always less than 0.001, the gain term at the beginning of equation 20 can be eliminated, resulting in equation 21, which is a relatively elegant approximation of the analog prototype filter represented by equation 14.

$$\hat{H}(z) = \frac{1 - 2z^{-1} + z^{-2}}{1 - (2 - 2\delta)z^{-1} + (1 - 2\delta)z^{-2}} \quad (21)$$

Recalling that this filter follows the integrator represented by equation 11, it is evident that the two operations can be combined because a pole and a zero at the origin will cancel. Cascading the two transfer functions results in the function represented below by equation 22.

$$P(z)\hat{H}(z) = \frac{K_o F_s (1 - z^{-1})}{1 - (2 - 2\delta)z^{-1} + (1 - 2\delta)z^{-2}} \quad (22)$$

A recursive difference equation corresponding to the cascaded transfer function of equation 22 is represented below by equation 23.

Simulations show that the output quantities, y, should be represented with 48-bit accuracy. However, the quantity $(1 - 2\delta)$ may be represented with only 24 bits, and calculations involving x require only single precision. Because the DSP56002 employed for DSP 32 can implement a single-precision times double-precision multiply in seven instruction cycles, equation 23 shows that the filter can be implemented using only one such multiply per output point.

In like manner to the above-described subband measurement mode, the wander measurement mode employs PLL 34 as a LPF. However, the wander filter further low pass filters the phase noise signal from ADC 54 to 10 Hertz. The additional 10 Hertz filter is preferably implemented in PLL 34 following the discrete loop filter, F(z), and the discrete VCO equivalent, P(z).

The wander filters are preferably first-order and the resulting data may be decimated at only a 30 Hertz sampling rate even though the aliasing distortion introduced by the decimation may approach 40 percent of the original incoming signal level.

The wander filter is preferably a first-order analog Butterworth filter having a transfer function represented below by equation 24:

$$H(s) = \frac{2\pi f_w}{s - 2\pi f_w}, \quad (24)$$

where fw is the cutoff frequency in Hertz, which is preferably 10 Hertz. Using the bilinear transform and approximations similar to equation 19, a reasonable approximation of the discrete equivalent filter is represented below by equation 25.

$$\hat{H}(z) = \frac{\pi f_w}{F_s}\left(\frac{1 + z^{-1}}{1 - \left(1 - \frac{2\pi f_w}{F_s}\right)z^{-1}}\right) \quad (25)$$

Combining the discrete VCo equivalent with the wander filter results in a cascaded transfer function represented below by equation 26.

$$P(z)\hat{H}(z) = K_o \pi f_w \left(\frac{1 + z^{-1}}{1 - \left(2 - \frac{2\pi f_w}{F_s}\right)z^{-1} + \left(1 - \frac{2\pi f_w}{F_s}\right)z^{-2}}\right) \quad (26)$$

Finally, a recursive difference equation of equation 26 is represented below by equation 27.

$$y_n = \left(2 - \frac{2\pi f_w}{F_s}\right)y_{n-1} - \left(1 - \frac{2\pi f_w}{F_s}\right)y_{n-2} + K_o \pi f_w (x_n + x_{n-1}) \quad (27)$$

Unlike the subband implementation, there is no need to represent the output samples, y, with more than 24-bit single precision data.

Because wander measurements are referenced to an ideal clock, it is necessary to subtract the ideal clock frequency represented by DDS 38 from the loop frequencies, x, before substituting them in equation 27. This is not required for subband measurements because the subband filters have a zero response at zero Hertz.

The analog output hardware represented by CIC filter 63, DAC 64, and analog PLF 66 provides an analog output signal corresponding to the filtered wideband, highband, or subband jitter signal.

The decimated data from DDFs 58 and 60 is converted to an analog signal by DAC 64, which runs at a 25.92 mega-Hertz sampling rate. Analog LPF 66 reconstructs the data signal and does not need to be sufficiently attenuated by the Nyquist frequency as represented below by equation 28.

$$\frac{25.92}{2 D_1 D_2} \text{ MHz} \tag{28}$$

Instead, analog LPF 66 takes advantage of a wider transition band caused by the narrow bandwidth of the digital data. The preferred passband and stopband frequencies are represented below by equations 29.

$$f_{start} = f_4 \text{ and } f_{stop} = \frac{25.92 \text{ MHZ}}{D_1 D_2} - f_4 \tag{29}$$

Skilled workers will recognize that portions of this invention may be implemented differently from the implementations described above for a preferred embodiment. For example, the invention is usable with a wider variety of incoming signal frequencies, electrical and electro-optical signal types, measurement frequencies, and measurement bandwidths than those described herein for telecommunications networks. For example, this invention is suitable for measuring jitter and wander in data storage drives, video cable transmission networks, video recorders, and digitally coded transmission media. Therefore, the clock frequencies, filter breakpoints, digitization rates, and related parameters may be changed to adapt accordingly. Likewise, for measuring incoming signals within limited frequency ranges, the prescalers and the tracking oscillator may be eliminated. Also, the invention may be adapted to perform only jitter or wander measurements, thereby allowing DDFs 58 and 60 to be eliminated in some cases. And, of course, depending on the measurement application, filtering employed by this invention may be most advantageously implemented with either analog or digital means.

It will be obvious to those having skill in the art that many changes may be made to the details of the above-described embodiment of this invention without departing from the underlying principles thereof. The scope of the present invention should, therefore, be determined only by the following claims.

We claim:

1. An apparatus for measuring at least one of an amount of jitter and an amount of wander present on a first electrical signal having a first frequency, comprising:

a reference clock;

a digital signal processor;

a digitally controlled frequency source generating in response to the reference clock and the digital signal processor a second electrical signal having a second frequency;

a phase detector receiving the first and second electrical signals and generating a phase signal proportional to a phase difference between the first and second frequencies;

an analog-to-digital converter digitizing the phase signal to generate phase signal data;

the digital signal processor processing the phase signal data and providing frequency control data to the digitally controlled frequency source such that the first and second frequencies are in a phase-locked condition; and a processor measuring at least one of the amount of jitter and the amount of wander on the first electrical signal in response to the phase signal data and the frequency control data.

2. The apparatus of claim 1 further including a clock recovery circuit that receives an incoming signal and produces the first electrical signal, the incoming signal being of a type selected from a group consisting of a nonreturn-to-zero formatted signal, a return-to-zero formatted signal, a code-mark-inversion formatted signal, an alternate-mark-inversion formatted signal, and a clock input signal.

3. The apparatus of claim 2 further including an incoming signal prescaler and in which the incoming signal has a signaling rate in a frequency range up to about 2.5 gigabits per second.

4. The apparatus of claim 3 in which the amount of jitter measurable on the incoming signal is in range from about zero unit intervals to about ±10 unit intervals.

5. The apparatus of claim 1 in which the digitally controlled frequency source includes a direct digital synthesizer, a tracking oscillator, and a prescaler that cooperate to generate the second frequency when the first frequency is substantially greater than a frequency generated by the direct digital synthesizer.

6. The apparatus of claim 1 in which the digital signal processor executes at least one of an integration function, a loop filter function, a high pass filter function, a frequency source integration mimicking function, and an out-of-lock detection function.

7. The apparatus of claim 6 in which the high pass filter function further includes a breakpoint that is programmable in a range from about 0.02 Hertz to about 20 Hertz.

8. The apparatus of claim 6 in which the loop filter function further includes a loop breakpoint that is programmable in a range from about 10 Hertz to about 2.5 kiloHertz.

9. The apparatus of claim 1 further including a decimating digital filter, the analog-to-digital converter digitizing the phase signal to generate jitter signal data that are filtered at a predetermined low pass breakpoint by the decimating digital filter.

10. The apparatus of claim 9 in which the decimating digital filter implements a finite impulse response filter function having at least a 60 decibel stopband attenuation.

11. The apparatus of claim 9 in which the predetermined low pass breakpoint is programmable in a range from about 40 kiloHertz to about 5 megaHertz.

12. The apparatus of claim 1 in which the amount of wander is measured in a wander band and the amount of jitter is simultaneously measured in at least one of a subband, a wideband, and a highband.

13. The apparatus of claim 12 in which the wander band spans a frequency range from about zero Hertz to about 10 Hertz.

14. The apparatus of claim 12 in which the subband spans a frequency range from about 0.02 Hertz to about 2.5 kiloHertz.

15. The apparatus of claim 12 in which the wideband spans a frequency range from about 10 Hertz to about 5 megaHertz.

16. The apparatus of claim 12 in which the highband spans a frequency range from about 3 kiloHertz to about 5 megahertz.

17. A method for measuring at least one of an amount of jitter and an amount of wander present on a first electrical signal having a first frequency, comprising:

receiving the first electrical signal;

generating with a digitally controlled frequency source responsive to a reference clock and a digital signal processor a second electrical signal having a second frequency;

producing with a phase detector a phase signal indicative of a phase difference between the first and second frequencies;

digitizing the phase signal to generate phase signal data;

processing digitally the phase signal data to provide frequency correction data to the digitally controlled frequency source such that the first and second frequencies are in a phase-locked condition; and processing the phase signal data and the frequency correction data to measure at least one of the amount of jitter and the amount of wander on the first electrical signal.

18. The method of claim 17 further including receiving an incoming signal and recovering the first electrical signal from the incoming signal.

19. The method of claim 18 in which the recovering step further includes prescaling the incoming signal.

20. The method of claim 19 in which the incoming signal is a digitally formatted signal having a signaling rate in a frequency range up to about 2.5 gigabits per second.

21. The method of claim 17 in which the generating step further includes generating in response to the frequency correction data a submultiple of the second frequency and producing the second electrical signal by tracking an oscillator to a multiple of the submultiple of the second frequency.

22. The method of claim 17 in which the processing digitally step further includes at least one of integrating the phase signal data, high pass filtering the phase signal data, loop filtering the phase signal data, and detecting in the phase signal data an out-of-lock condition.

23. The method of claim 22 in which the high pass filtering step further includes setting digitally a high pass breakpoint in a range from about 500 Hertz to about 250 kiloHertz.

24. The method of claim 22 in which the loop filtering step further includes setting digitally a low pass breakpoint in a range from about 10 Hertz to about 2.5 kilohertz.

25. The method of claim 17 further including filtering digitally at a predetermined low pass breakpoint the phase signal data, and processing the filtered phase signal data to measure the amount of jitter present on the first electrical signal.

26. The method of claim 25 in which the filtering step includes implementing a finite impulse response filter function having at least a 60-decibel stopband attenuation.

27. The method of claim 25 in which the predetermined low pass breakpoint is digitally settable in a range from about 40 kiloHertz to about 5 megaHertz.

28. The method of claim 17 in which the processing the phase signal step further includes measuring the amount of wander present on the first electrical signal in a wander band.

29. The method of claim 28 in which the wander band spans a frequency range from about zero Hertz to about 10 Hertz.

30. The method of claim 17 in which the processing the phase signal step further includes measuring the amount of jitter present on the first electrical signal in at least one of a subband, a wideband, and a highband.

31. The method of claim 30 in which the subband spans a frequency range from about 0.02 Hertz to about 2.5 kilohertz.

32. The method of claim 30 in which the wideband spans a frequency range from about 10 Hertz to about 5 megaHertz.

33. The method of claim 30 in which the highband spans a frequency range from about 3 kiloHertz to about 5 megaHertz.

34. An apparatus for measuring an amount of jitter present on a first electrical signal, comprising:

a phase-lock loop controlled by a digital signal processor and including an oscillator generating a second electrical signal responsive to a reference clock and the digital signal processor;

a phase detector receiving the first and second electrical signals and generating a phase difference signal;

an analog-to-digital converter digitizing the phase difference signal to produce jitter signal data;

a decimating digital filter filtering the jitter signal data at a predetermined low pass breakpoint; and a processor processing the filtered jitter signal data to measure the amount of jitter present on the first electrical signal.

35. The apparatus of claim 34 in which the first electrical signal has a frequency in a range up to about 2.5 gigaHertz.

36. The apparatus of claim 34 further including a digital-to-analog converter for reconstructing an analog jitter signal from the filtered jitter signal data.

37. The apparatus of claim 34 in which the decimating digital filter implements a finite impulse response filter function having at least a 60 decibel stopband attenuation.

38. The apparatus of claim 34 in which the decimating digital filter has at least a 60 decibel per decade attenuation slope.

39. The apparatus of claim 34 in which the decimating digital filter includes at least a first finite impulse response filter in series with a second finite impulse response filter.

40. The apparatus of claim 39 in which the first finite impulse response filter has a decimation ratio in a range of about 1 to about 16 and the second finite impulse response filter has a decimation ratio in range of about 1 to about 4.

41. The apparatus of claim 39 in which the decimating digital filter has a stopband attenuation of at least about 70 decibels.

42. The apparatus of claim 34 in which the amount of jitter present in the first electrical signal is measured in a frequency band spanning frequencies between the predetermined low pass breakpoint of the digital decimating filter and a predetermined high pass breakpoint that is controllable in the phase-lock loop.

43. The apparatus of claim 42 in which the predetermined low pass breakpoint is programmable in a frequency range from about 40 kiloHertz to about 5 megaHertz.

44. The apparatus of claim 42 in which the predetermined high pass breakpoint is programmable in a frequency range from about 500 Hertz to about 5 kiloHertz.

* * * * *